United States Patent [19]

Wipfelder

[11] Patent Number: 5,216,632
[45] Date of Patent: Jun. 1, 1993

[54] MEMORY ARRANGEMENT WITH A READ-OUT CIRCUIT FOR A STATIC MEMORY CELL

[75] Inventor: Werner Wipfelder, Munich, Fed. Rep. of Germany

[73] Assignee: Messerschmitt-Bolkow-Blohm GmbH, Munich, Fed. Rep. of Germany

[21] Appl. No.: 806,524

[22] Filed: Dec. 13, 1991

[30] Foreign Application Priority Data

Dec. 21, 1990 [DE] Fed. Rep. of Germany ....... 4041260

[51] Int. Cl.$^5$ ............................................. G11C 11/34
[52] U.S. Cl. ................................. 365/181; 365/174
[58] Field of Search ................. 365/174, 181, 182; 357/45, 51

[56] References Cited

U.S. PATENT DOCUMENTS

| | | | |
|---|---|---|---|
| 3,416,008 | 12/1968 | Memelink et al. | 365/181 |
| 3,918,033 | 11/1975 | Case et al. | 365/174 |
| 3,919,569 | 11/1975 | Gaensslen et al. | 365/181 |
| 3,975,718 | 8/1976 | Goser | 365/181 |
| 4,459,684 | 7/1984 | Chapman | 365/174 |

FOREIGN PATENT DOCUMENTS 0064697 4/1983 Japan .................................. 365/181

Primary Examiner—Eugene R. LaRoche
Assistant Examiner—Son Dinh
Attorney, Agent, or Firm—Kenyon & Kenyon

[57] ABSTRACT

A memory arrangement that includes a static memory cell with two MOSFETs that are connected such that an input signal for setting the memory cell is applied to one MOSFET, and the output of the other MOSFET is connected to the input of the first MOSFET, so that one MOSFET is always conductive while the other is blocked. The two MOSFETs are connected with positive feedback. In each case, the gate electrode is connected to a voltage equal to half the battery voltage. The source electrode of the first (N channel) MOSFET forms the input of the memory cell. The drain electrode of the first MOSFET is connected to the source electrode of the second (P channel) MOSFET. The blocking resistance of the drain-substrate diode of the first MOSFET is greater than the blocking resistance of the source-substrate diode of the second MOSFET. Also, the output voltage of the first (N channel) MOSFET is greater than the sum of the gate voltage and the threshold voltage of the second (P channel) MOSFET.

11 Claims, 3 Drawing Sheets

5,216,632

MEMORY ARRANGEMENT WITH A READ-OUT CIRCUIT FOR A STATIC MEMORY CELL

FIELD OF THE INVENTION

The present invention relates to a memory arrangement that includes several transistors, and, in particular, a memory arrangement that includes at least two MOS field effect transistors that are coupled with feedback.

BACKGROUND INFORMATION

Simple static memory cells, for example, may be flip-flops which are composed of two transistors coupled with feedback. Flip-flops have two defined operating states. In each state one of the transistors is conductive and the other is blocked. Flip-flops can be switched from the one stable operating state to the other through an input signal at one of the two transistors, i.e., the input transistor.

U.S. Pat. No. 4,158,239 (Re. 32,071) describes a memory cell which has high power and space requirements. For memory cells that have transistors, additional components, especially resistors, must be used in order to adapt the operating parameters of the transistors to each another. These additional components must also be connected with the transistors via connection lines. This results in a relatively high amount of circuit complexity. This becomes significant, in particular, for the integration of the memory cell on semiconductor chips. In such integrated memory cell arrangements, it is desirable to keep the space requirement for the individual memory cells, as well as for the connection of these individual memory cells, as small as possible, in order to integrate the largest possible number of memory cells on a semiconductor chip.

SUMMARY OF THE INVENTION

The present invention provides a memory arrangement having low circuit complexity, even with regard to additional components, so that the memory arrangement has small dimensions and, therefore, a plurality of memory cells can be integrated on a semiconductor chip.

An embodiment of a static memory cell according to the present invention includes two complementary transistors, preferably MOS field effect transistors ("MOSFETs"), which can be connected directly, with positive feedback, without additional components, so that the drain output of each transistor is directly connected with the source input of the other transistor.

Another embodiment of a static memory cell according to the present invention has two stable operating states, i.e., HIGH and LOW, or written in digital form, "1" and "0." An output signal can be sampled, for example, at the output of the second transistor.

Still another embodiment of a static memory cell according to the present invention is controlled by a digital signal via a driver, preferably, a tri-state driver, which causes the memory cell to be set.

DETAILED DESCRIPTION

Figure 1:
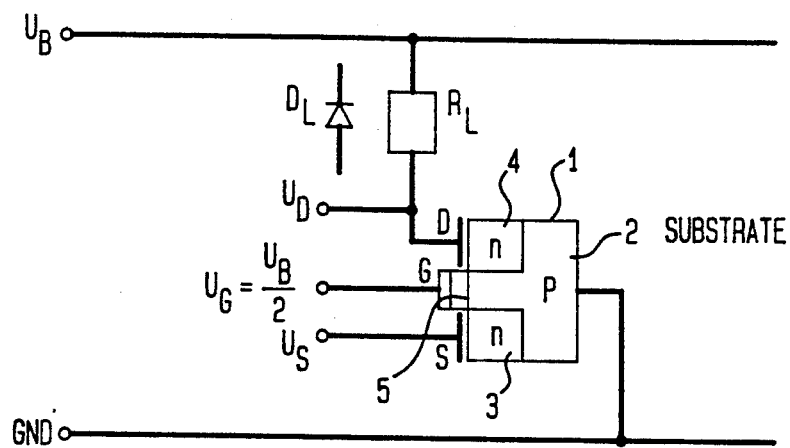
FIG. 1 shows a circuit of an N channel MOSFET which is controlled at the source electrode.

FIG. 1 shows an npn MOS transistor 1, i.e., an N channel MOSFET having a p-doped substrate 2 and n-doped source and drain areas 3 and 4, as well as a gate area 5. These areas have a source electrode S, a drain electrode D and a gate electrode G, respectively. The substrate 2 is connected to a ground potential GND, e.g., zero volts. An input signal is applied to the source electrode S as an input voltage $U_S$. The gate electrode G is connected to a voltage $U_G$, which corresponds to half the value of a battery voltage $U_B$ (i.e., $U_B/2$), for example. An output voltage $U_D$ can be sampled at the drain electrode D. The drain electrode D is connected to a line carrying the battery voltage $U_B$, via a load resistor $R_L$. The load resistor $R_L$ can be replaced by a diode $D_L$ provided that the diode, corresponding to the transition between drain area 4 and substrate 2, lying in the blocking direction has a higher resistance value than the diode $D_L$ which also lies in the blocking direction.

Figure 2:
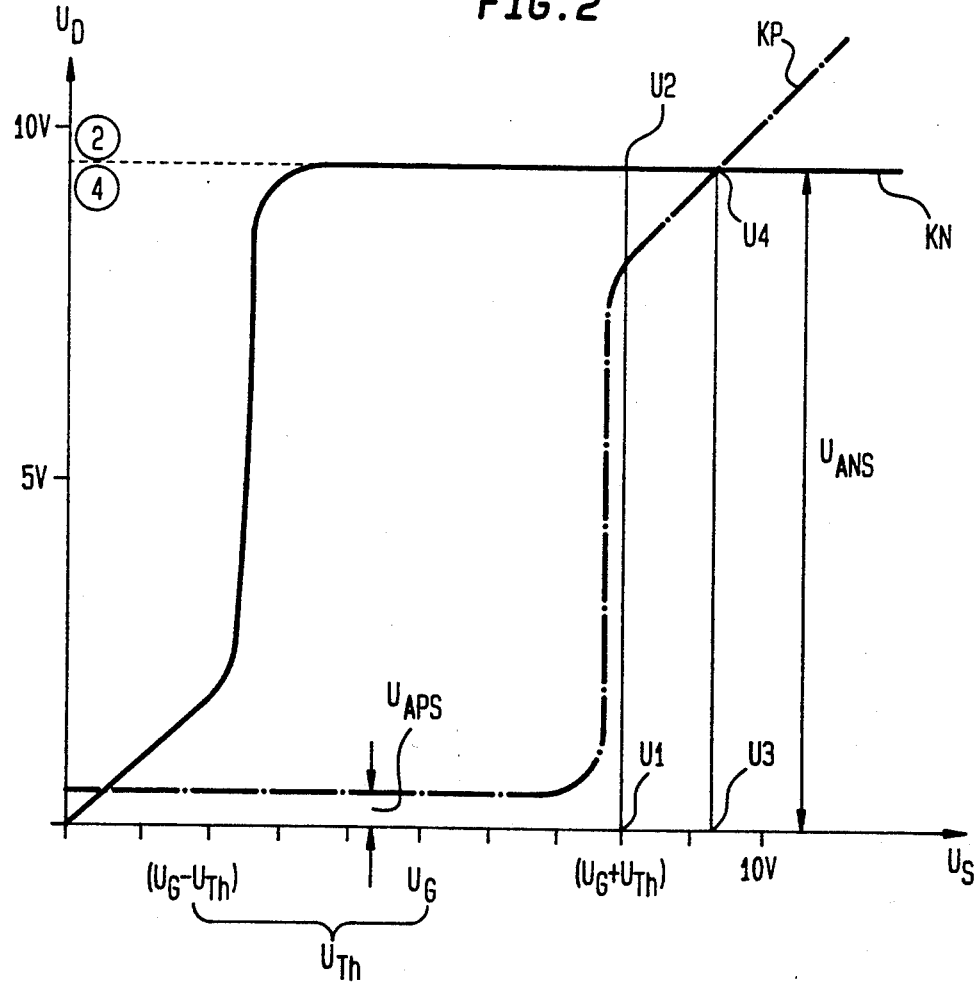
FIG. 2 shows a characteristic curve of the transistor shown in FIG. 1, whereas, the output voltage at the drain electrode is a function of the input voltage fed to the source electrode, and shows a characteristic curve for a corresponding complementary P channel MOSFET.

This circuit has the characteristic curve KN shown in FIG. 2. In FIG. 2, the output voltage $U_D$ at the drain electrode is plotted as a function of the input voltage $U_S$ at the source electrode. As the input voltage $U_S$ increases, starting from the value of zero volts, the output voltage $U_D$ at the drain electrode follows the input voltage in an essentially linear manner, so long as the voltage difference between the gate electrode and the source electrode is greater than the threshold voltage $U_{Th}$ of the transistor, i.e., the transistor is conductive. The distance between the source area 3 and the drain area 4 of the MOSFET has a significantly lower resistance value than the load $R_L$ or $D_L$ lying in the blocking direction, and has a lower resistance value than the pn transition between the source area 3 and the substrate 2. If the input voltage continues to increase, the voltage between the gate electrode and the source electrode (or the control voltage) of the MOSFET becomes less than the threshold voltage $U_{Th}$, corresponding to the difference ($U_G-U_S$), so that the transistor blocks. The output voltage of the transistor increases to a value $U_{ANS}$ with this connection. The amount of this output voltage is essentially determined by the voltage divider, consisting of $R_L$ or $D_L$, and the diode between the drain area 4 and the substrate 2.

If the N channel MOSFET in FIG. 1 is replaced with a P channel MOSFET, the curve KP drawn with a dot-dash line in FIG. 2 results. The P channel MOSFET remains blocked when the input voltage $U_S$ is applied to the source electrode, and $U_S < U_G + U_{Th}$, and only becomes conductive when the input voltage $U_S$ exceeds the sum of the gate voltage $U_G$ and the threshold voltage $U_{Th}$.

$U_{Th}$ of the MOS-FET is approximately 3V. The Characteristic curve shown in FIG. 2 is based on an N channel MOSFET which is blocked at an input voltage $U_S$ of approximately two volts, and a P channel MOSFET which becomes conductive starting at approximately eight volts.

Figure 3:
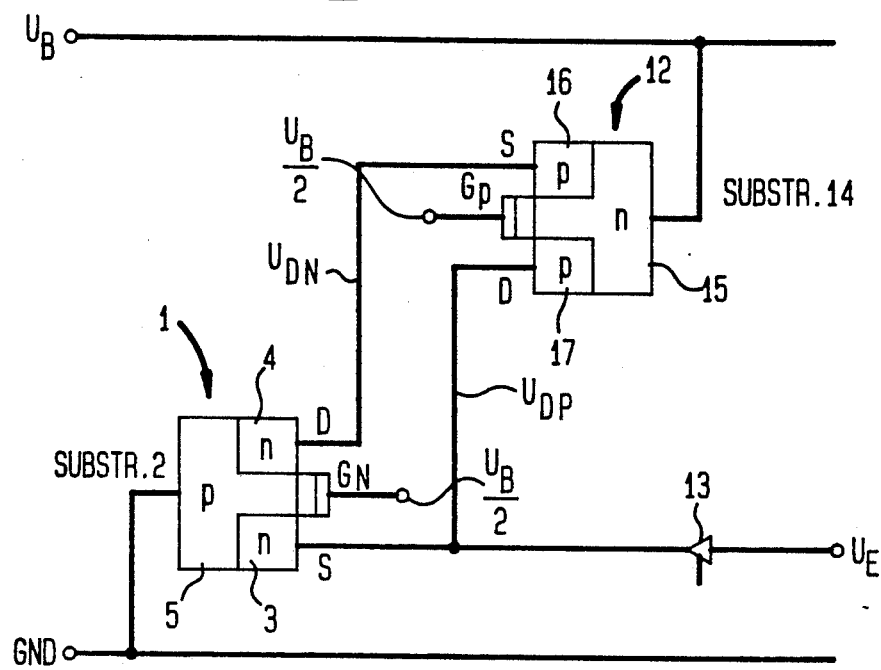
FIG. 3 shows a circuit diagram of a static memory cell according to the present invention with two complementary MOSFETs.

FIG. 3 shows a circuit diagram of a static memory cell 11 having an N channel MOSFET 1 corresponding to FIG. 1 and a P channel MOSFET 12. The substrate 2 of the transistor 1 is at ground potential GND, the gate electrode $G_N$ is at half the battery voltage, the input signal $U_E$ to be stored in memory is applied to the source electrode S via a tri-state driver 13, and the output voltage $U_D$ can be sampled at the drain electrode. The drain electrode 4 is connected to the source electrode 16 of the second transistor 12. The drain electrode 17 of the second transistor 12 is connected to the source electrode 3 of the first transistor 1. The gate electrode $G_P$ of the second transistor is also connected to half the battery voltage $U_B/2$.

The memory cell of FIG. 3 no longer requires external components. The diode connected between the source and substrate of the transistor in the blocking direction is the load of the other transistor in each instance. The output voltage $U_{DN}$ of the first transistor is the input voltage for the second transistor, while the output voltage $U_{DP}$ of the latter, output from the drain electrode $D_P$, is applied to the first transistor at the source electrode, as the input voltage. If the diode between the drain and substrate of a transistor in either case, which lies in the blocking direction here, has a higher resistance value than the diode between the source and substrate of the other transistor, the characteristic curves $K_N$ and $K_P$ shown in FIG. 2 also apply for the two transistors 1, 12.

If a HIGH or "1" signal of eight volts, corresponding to the voltage value U1 in FIG. 2, for example, is applied to the driver 13 as an input signal in order to write to the memory cells and subsequently the driver 13 is switched to the high resistance state, the N channel MOSFET 1 blocks, and delivers an output voltage U2 corresponding to the voltage $U_{ANS}$ in the blocked state. This output voltage is the input voltage to the complementary P channel MOSFET 12, i.e., the voltage U3. The conductive P channel MOSFET delivers an output voltage corresponding to U4 in FIG. 2, which in turn is the input voltage for the N channel MOSFET 1 and continues to block the latter. The stable operating condition established by a pulse-shaped input signal $U_E$ remains statically stored as a result (solid line U4 shown at the top of FIG. 2).

If a "0" input voltage is applied to the input of the memory cell, the transistors exchange their roles and the second stable state of the memory cell is obtained, in which the first transistor 1 is conductive and the second complementary transistor 12 is blocked. This second stable operating state lies approximately at the intersection of the two characteristic lines KN and KP, in the lower voltage range $U_{APS}$ (dot-dash line shown at the bottom of FIG. 2).

For the functioning of this circuit, it is important that the output voltage $U_{ANS}$ of the blocked first transistor 1 is greater than the sum of the voltages $U_G$ and $U_{Th}$, and furthermore, that the output voltage $U_{APS}$ of the blocked second complementary transistor is less than $(U_G - U_{Th})$, so that the output voltage of the blocking transistor in each case operates the other transistor in the linear range of the characteristic curve, in accordance with the conductive state.

As explained above, the diode must be at a higher resistance value, corresponding to the transition between the drain and the substrate of the one transistor, than the other connected diode, corresponding to the transition between the source and the substrate of the other transistor, in each instance. The blocking current $J_S$ of one diode is dependent on the area of the corresponding pn transition. This makes it possible to determine the resistance of a blocked diode by sizing this area in such a way that the diode in question has a lower resistance value at the source-substrate transition than the connected diodes at the transition between drain and substrate.

Figure 4:
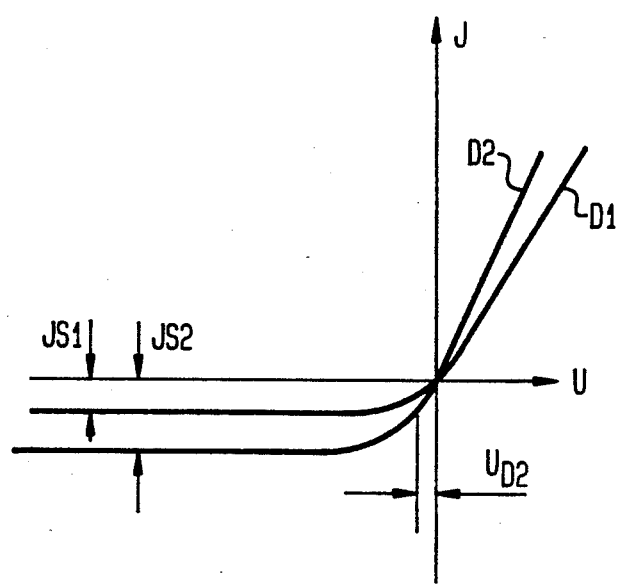
FIG. 4 shows a current-voltage characteristic curve for two diodes of two different transistors formed by the pn transitions of the MOSFETs.

FIG. 4 shows the characteristic curves of two different diodes D1 and D2, where the blocking current of the first diode is designated as $J_{S1}$ and the blocking current of the second diode is designated as $J_{S2}$. If one assumes that the two field effect transistors have the same substrate and were manufactured according to the same process, and if the diode D2 has a greater area at the pn transition than the diode D1, then the diode D2 will also have a greater blocking current. Since these two diodes are connected in series in the circuit shown in FIG. 3, the current $J_{S1}$ flows through them. This generates a voltage drop $U_{D2}$ at the diode D2, while the remaining voltage is applied to the diode D1. With the measure of different sizings of the pn transitions, it is therefore possible to fulfill the above requirement with regard to the resistance value at these transitions.

The static memory cell 11 includes two complementary MOSFETs 1, 12, where the source electrode of the first (N channel) transistor forms the input of the memory cell; the drain electrode of the first transistor is connected to the source electrode of the second (P channel) transistor; and the drain electrode of the second transistor is connected to the source electrode of the first transistor. The p substrate of the first transistor is connected to a ground line, and the n substrate of the second transistor is connected to a line that carries the battery or supply voltage. The gate areas of the two transistors are connected to a voltage equal to half the battery voltage.

For a memory arrangement with a static memory cell of the type described above, a read-out circuit is described below. This circuit is of low complexity, and thus the data can be read out of the memory cell without problems.

The present invention provides a third MOSFET of the N channel type for this purpose, the gate electrode of which is connected to the source electrode of the first (N channel) transistor, the source electrode of which is connected to a word line carrying a write signal, and the drain electrode of which is connected to a load resistor via a data line.

This makes it possible to achieve the new memory arrangement with a read-out circuit with only a single transistor and a load resistor. The third resistor is blocked if a HIGH signal is applied to the source electrode via the word line, and is conductive if this signal is a LOW signal. If the third transistor is blocked, a signal is applied to the output of this transistor, which is independent of the content of the memory cell. If this third transistor is controlled to read-out, via the source electrode, then the data of the memory cell appears at the output of this transistor, but in inverted form. This data can be taken via the data line. The high resistance at the gate area of the third MOSFET furthermore guarantees that the static memory cell can drive the third transistor. By connecting this third transistor, and because of its capabilities as a driver stage for the memory cell, a usable signal is obtained even on an extensive data line. The circuit also provides for problem-free driving of loads, for example, lines in integrated circuits.

Figure 5:
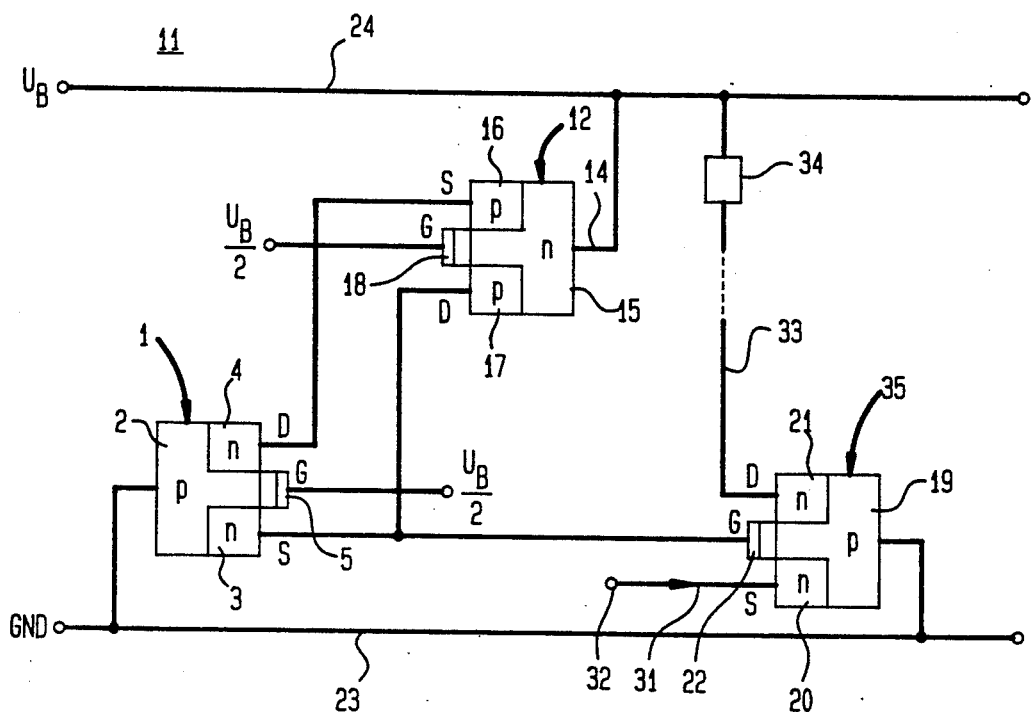
FIG. 5 shows a memory arrangement with a read-out circuit.

According to FIG. 5, the static memory cell 11 has a first N channel MOSFET 1, a second P channel MOSFET 12, and a third N channel MOSFET 35 as the read-out transistor. The first transistor 1 has a substrate 2, a source electrode 3, a drain electrode 4, as well as a gate electrode 5. The corresponding substrate, drain D, source S, and gate G are designated 15, 17, 16 and 18, respectively, for the second MOSFET transistor 12, and 19, 21, 20 and 22, respectively, for the third MOSFET transistor 35. The substrate 2 of the first transistor 1, as well as the substrate 19 of the third transistor, is connected to a ground line 23 carrying the reference potential, in this case, the ground potential GND. The substrate 15 of the second transistor 12 is connected to a supply line 24, which is connected to the supply or battery voltage $U_B$. The gate electrodes of the first two transistors 1 and 12 are each connected to half the battery voltage.

The two transistors 1 and 12 are connected with positive feedback, i.e., the drain electrode 4 of the first transistor 1 is connected to the source electrode 16 of the second transistor 12, and the drain electrode 17 of the second transistor 12 is connected to the source electrode 3 of the first transistor 1. The source electrode 3 of the first transistor serves as the output of the memory cell and is connected to the gate electrode 22 of the third transistor 35.

The source electrode 20 of this third transistor 35 is connected to a word line 31, which leads to a write connection 32. The drain electrode 21 of the third transistor 35 is connected to a load resistor 34 via a data line 33. The load resistor 34 in turn is connected to the supply line 24.

With regard to sizing of the two memory transistors 1 and 12, reference is made to the description of FIG. 3. The diode between the drain and substrate of one transistor, lying in the blocking direction, formed by a pn transition in each case, must have a higher resistance value than the diode between source and substrate formed by the pn transition of the other transistor in each instance. This can be done, for example, by corresponding sizing of the areas of the pn transitions in each case.

Furthermore, it is important for the functioning of the circuit that the output voltage of the blocked first (N channel) transistor 1 be greater than the sum of the gate voltage and threshold voltage of the second (P channel) transistor, and furthermore, that the output voltage when the second (P channel) transistor 12 is blocked be less than the difference between the gate voltage and the threshold voltage of the first (N channel) transistor 1. This ensures that the output voltage of the transistor that is blocked, in each instance, operates the other transistor in the conductive state in the linear range of its characteristic curve.

To write to the memory cell, a HIGH or "1" signal of approximately 8 volts is applied to the source electrode 3 of the first transistor. If the driver circuit is then switched to the high resistance state, the first (N channel) transistor 1 blocks. Its output voltage is the input voltage for the complementary second transistor 12, the output voltage of which in turn is the input voltage for the first transistor 1, and continues to block the latter. The operating state established by a pulse-shaped input signal therefore remains statically stored.

The third transistor 35 serves for read-out. If a HIGH or "1" signal is present on the word line 31, the third transistor 35 blocks, and a HIGH signal is present at its output, independent of the data content of the memory cell. If the signal on the word line 31 is switched to LOW or "0," the data stored in the two memory transistors 1 and 2 appears at the output, i.e., at the drain electrode 21 of the third transistor, but in inverted form. This data can be passed to the data line 33 via the load resistor 34, in a conventional manner.

Because of the high resistance of the gate electrode of the transistor 35, the memory cell which includes the memory transistors 1 and 12 can also drive the third read-out transistor 35.

Figure 6:
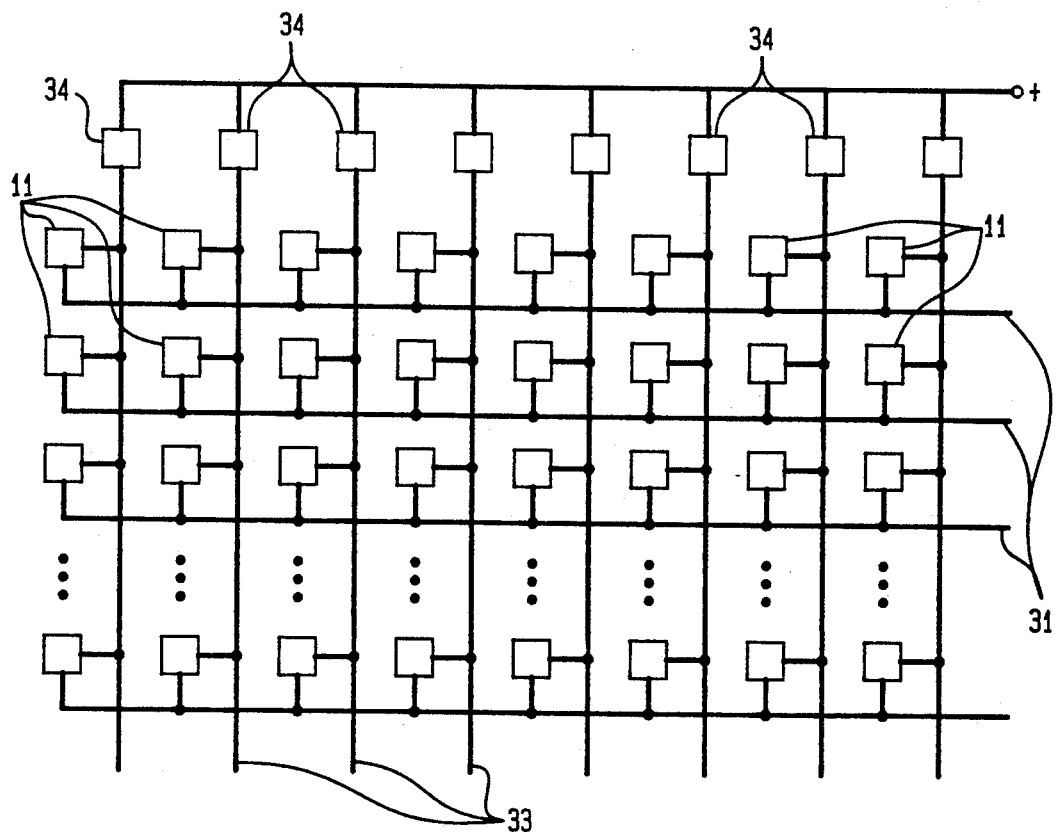
FIG. 6 shows a plurality of memory cells according to the present invention which are integrated into a matrix of data and word lines.

FIG. 5 shows the data line 33 between the drain electrode 21 of the third transistor 35 and the load resistor 34 with a broken line, which indicates that it is advantageous if a plurality of such memory cells, as shown in FIG. 6, are arranged in a matrix structure of data lines 33 and word lines 31, with the connections of the word lines 31 of all memory cells being brought together in one line, and the connections of the data lines 33 being brought together in one column. Each load resistor 34 is a common load resistor for all memory cells arranged in a column, in such a case.

What is claimed is:

1. A memory cell comprising:
   (a) a first FET that includes a first source for receiving an input signal of the memory cell, a first gate, a first drain for providing a first output voltage, and a first substrate disposed between the first source and the first drain, with the first FET having a first blocking resistance between the first drain and the first substrate, and
   (b) a second FET having a predetermined threshold voltage, the second FET including a second source coupled to the first drain of the first FET, a second gate having a gate voltage, a second drain coupled to the first source, and a second substrate disposed between the second source and the second drain, with the second FET having a second blocking resistance between the second source and the second substrate that is less than the first blocking resistance, and with the sum of the gate voltage and the threshold voltage of the second FET being less than a first output voltage.

2. The memory cell as recited in claim 1, wherein the first substrate is coupled to a first voltage level, and the second substrate is coupled to a second voltage level.

3. The memory cell as recited in claim 2, wherein the gate of both the first and second FETs are coupled to a predetermined level less than the second voltage level.

4. The memory cell as recited in claim 3, wherein the memory cell further comprises a tri-state driver which has an output that is coupled to the first source and to the second drain.

5. The memory cell as recited in claim 4, wherein when the first FET is conductive, the second FET is blocking, and when the first FET is blocking, the second FET is conductive.

6. The memory cell as recited in claim 5, wherein a transition area between the first source and first substrate is greater than a transition area between the second drain and second substrate, and a transition area between the second source and second substrate is greater than a transition area between the first drain and first substrate.

7. The memory cell as recited in claim 6, wherein second drain provides a second output voltage, the first FET has an additional threshold voltage, the first gate has an additional gate voltage, with the second output voltage being less than the difference between the additional gate voltage and the additional threshold voltage when the second FET is blocking.

8. The memory cell as recited in claim 1, wherein the memory cell further comprises a third FET that includes a third source for receiving write signals via a word line, a third gate coupled to the first source, and a third drain coupled to a load resistor via a data line.

9. A memory system comprising:
a plurality of memory cells arranged in a matrix formed by a plurality of data lines and a plurality of word lines disposed perpendiculary to the data lines, each of the memory cells being connected to one data line and to one word line, with each memory cell further comprising,
(a) a first FET that includes a first source for receiving an input signal of the memory cell, a first gate, a first drain for providing a first output voltage, and a first substrate disposed between the first source and the first drain, with the first FET having a first blocking resistance between the first drain and the first substrate, and
(b) a second FET having a predetermined threshold voltage, the second FET including a second source coupled to the first drain of the first FET, a second gate having a gate voltage, a second drain coupled to the first source, and a second substrate disposed between the second source and the second drain, with the second FET having a second blocking resistance between the second source and the second substrate that is less than the first blocking resistance, and with the sum of the gate voltage and the threshold voltage of the second FET being less than a first output voltage.

10. The memory system as recited in claim 9, wherein the memory system further comprises a plurality of load resistors, with each load resistor being coupled to a data line corresponding to a memory cell.

11. The memory system as recited in claim 10, wherein each memory cell further comprises a third FET that includes a third source for receiving write signals via the word line to which the memory cell is coupled, a third gate coupled to the first source, and a third drain coupled to the load resistor corresponding to the data line to which the memory cell is coupled.

* * * * *